United States Patent
Ikeguchi et al.

(10) Patent No.: US 6,562,179 B1
(45) Date of Patent: May 13, 2003

(54) HIGH RELATIVE-PERMITTIVITY B-STAGED SHEET, HIGH RELATIVE-PERMITTIVITY PREPREG, ITS PRODUCTION PROCESS, AND PRINTED WIRING BOARD COMPRISING ANY ONE OF THESE

(75) Inventors: Nobuyuki Ikeguchi, Tokyo (JP); Masahiro Shimoda, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 148 days.

(21) Appl. No.: 09/697,134

(22) Filed: Oct. 27, 2000

(30) Foreign Application Priority Data

| Nov. 4, 1999 | (JP) | ............................................. 11-313244 |
| Mar. 30, 2000 | (JP) | ....................................... 2000-092815 |
| Mar. 30, 2000 | (JP) | ....................................... 2000-092816 |
| Jul. 4, 2000 | (JP) | ....................................... 2000-202609 |

(51) Int. Cl.⁷ .................................................. C09J 5/02
(52) U.S. Cl. ................................... 156/307.5; 523/442
(58) Field of Search ........................ 156/307.5; 523/442

(56) References Cited

FOREIGN PATENT DOCUMENTS

| JP | 53-52999 | * | 5/1978 | ................. 523/442 |
| JP | 57-11026 | * | 1/1982 | ............. 156/307.5 |
| JP | 61-167547 | | 7/1986 | |

OTHER PUBLICATIONS

Patent Abstracts of Japan, vol. 1998, No. 11, Sep. 30, 1998, Abstract of JP 10–158472 A.

Patent Abstracts of Japan, vol. 1999, No. 11, Sep. 30, 1999, Abstract of JP 11–171975 A.

Patent Abstracts of Japan, vol. 015, No. 060 (C–0805), Feb. 13, 1991, Abstract of JP 02–286723 A.

* cited by examiner

*Primary Examiner*—John J. Gallagher
(74) *Attorney, Agent, or Firm*—Wenderoth, Lind & Ponack, L.L.P.

(57) ABSTRACT

A high relative-permittivity B-staged sheet obtained by incorporating an insulating inorganic filler having a relative permittivity of at least 500 at room temperature into a solvent-less resin component so as to have an insultaing inorganic filler content of 80 to 99% by weight, a high relative-permittivity prepreg obtained from the above high relative-permittivity B-staged sheet, a process for the production of the high relative-permittivity prepreg, and a printed wiring board obtained from any one of the above high relative-permittivity B-staged sheet and the high relative-permittivity prepreg.

7 Claims, 2 Drawing Sheets

Fig. 2

HIGH RELATIVE-PERMITTIVITY B-STAGED SHEET, HIGH RELATIVE-PERMITTIVITY PREPREG, ITS PRODUCTION PROCESS, AND PRINTED WIRING BOARD COMPRISING ANY ONE OF THESE

FIELD OF THE INVENTION

The present invention relates to a B-staged sheet having a high relative permittivity, prepreg having a high relative permittivity, its production process and a printed wiring board using its copper-clad board as a condenser or the like. Particularly, a printed wiring board obtained by making a hole with a carbon dioxide gas laser is suitably used for a semiconductor chip-mounting, small-sized, light weight and novel printed wiring board, as a high-density and small-sized printed wiring board.

PRIOR ARTS OF THE INVENTION

In recent years, a high-density multi-layered printed wiring board is used for an electrical equipment which is decreased in size, thickness and weight. When a layer having a high relative permittivity is provided as an inner or outer layer of the printed wiring board and the layer is used as a condenser, a packaging density can be improved. A layer having a high relative permittivity has been made as an inner layer, an outer layer or a substrate of a multi-layered board by a method disclosed in JP-A-55-57212, JP-A-61-136281, JP-A-61-167547, JP-A-62-19451 or JP-B-5-415, in which an inorganic powder having a high relative permittivity, such as barium titanate, is incorporated in an epoxy resin, a modified polyphenylene oxide resin or the like, a fiber substrate such as a glass fabric is impregnated with the resultant mixture, the mixture is dried to obtain prepregs, a plurality of the prepregs are stacked, copper foils are placed thereon as the outermost layers, and the resultant set is laminate-formed to produce a copper-clad laminate having a high relative permittivity. This glass-fabric-substrate copper-clad laminate has a thick glass fabric thickness as thick as at least 409 $\mu$m. When a resin is attached thereto, therefore, the thickness becomes 60 $\mu$m or more. It has been impossible to produce a glass-fabric-substrate copper-clad laminate having a thinner insulation layer. In addition, the inorganic filler has a heavy specific gravity so that when the inorganic filler is dispersed in a varnish, it settled down. Therefore, there is found no case in which a large amount of the inorganic filler is incorporated. Further, the glass-fabric-substrate copper-clad laminate has a glass fabric substrate, so that it is difficult to impregnate a glass fabric substrate with a resin composition containing the inorganic filler in a large amount as large as at least 80% by weight and it is also difficult to attach the resin composition in a large amount to the surface of a fabric. Further, cracks of the resin composition and unevenness are found, and it is impossible to produce a fine prepreg. Therefore, when prepreg is prepared, the amount of the inorganic filler in the resin composition is generally 70% by weight or less. A plurality of the so-obtained prepregs are stacked, copper foils are disposed as the outermost layers, and the resultant set is laminate-formed to prepare a copper-clad laminate having a high relative permittivity. In Examples disclosed in each of the above publications, there are obtained only glass-fabric-substrate copper-clad laminates having a relative permittivity of about 10 to 20. Therefore, it is impossible to form a condenser having a large capacitance, and it is difficult to use the above copper-clad laminate as a copper-clad board having a condenser function.

On the other hand, even a copper-clad laminate obtained by using a resin composition containing a general thermosetting resin and an inorganic powder having a high relative permittivity is fragile and is weak in copper foil adhesion strength, when the inorganic filler is incorporated in a large amount. Further, it is impossible to produce a copper-clad board having high heat-resistance and having a relative permittivity of 50 or more, still less 100 or more. As shown in JP-A-9-12742, a high relative-permittivity film obtained by mixing a thermosetting resin with an inorganic powder having a relative permittivity of at least 50 without using a glass fabric substrate has a high resin viscosity in order to form the mixture into a film. Therefore, the upper limit of the content of the inorganic filler is about 60% by weight. Consequently, an obtained copper-clad laminate comprising the above film has a small relative permittivity as small as about 10. There is not obtained a copper-clad laminate having a relative permittivity of at least 50.

SUMMARY OF THE INVENTION

It is an object of the present invention to provide a high relative-permittivity B-staged sheet which has a thin insulation layer thickness of, for example, 50 $\mu$m or less and a large relative permittivity of at least 50 and which is processible like a general glass-fabric-substrate thermosetting resin prepreg, and a printed wiring board obtained by making a penetration hole and/or a blind via hole in a copper-clad board comprising the B-staged sheet.

It is another object of the present invention to provide a high-density printed wiring board including a copper-clad board comprising the above B-staged sheet which is suitable for making a hole having a small diameter with a carbon dioxide gas laser.

It is further another object of the present invention to provide a prepreg having a high relative permittivity in which a resin composition excellently adheres to a substrate even when the resin composition contains a thermosetting resin and at least 80% by weight of an inorganic filler, which is excellent in adhesion strength to a copper foil when a copper-clad laminate is prepared by using the prepreg, which has a large relative permittivity of at least 10, preferably at least 20, and which is processible like a general glass-fabric-substrate thermosetting resin prepreg, and a production process thereof.

It is still another object of the present invention to provide a printed wiring board using a copper-clad laminate comprising the above high relative-permittivity prepreg.

According to the present invention 1, there is provided a high relative-permittivity B-staged sheet obtained by incorporating an insulating inorganic filler having a relative permittivity of at least 500 at room temperature into a solvent-less resin component so as to have an insulating inorganic filler content of 80 to 99% by weight, preferably 85 to 95% by weight.

According to the present invention, there is also provided a high relative-permittivity B-staged sheet according to the above, wherein the solvent-less resin component contains, as an essential component, a resin composition obtained by incorporating 50 to 10,000 parts by weight of an epoxy resin (b) that is liquid at room temperature into 100 parts by weight of a monomer of a polyfunctional cyanate ester and/or a prepolymer of said cyanate ester (a) and incorporating 0.005 to 10 parts by weight of a heat-curing catalyst per 100 parts by weight of the total amount (a+b) of the monomer of the polyfunctional cyanate ester and/or the prepolymer of said cyanate ester and the epoxy resin.

According to the present invention, there is also provided a high relative-permittivity B-staged sheet according to the above, wherein the above insulating inorganic filler is a product which contains at least one ceramic selected from the group consisting of a barium titanate-containing ceramic, a lead titanate-containing ceramic, a calcium titanate-containing ceramic, a magnesium titanate-containing ceramic, a bismuth titanate-containing ceramic, a strontium titanate-containing ceramic and a lead zirconate-containing ceramic or which is obtained by sintering at least one ceramic selected from the above group and pulverizing the sintered ceramic.

According to the present invention, there is also provided a printed wiring board obtained by making a penetration hole and/or a blind via hole in a copper-clad board having the above B-staged sheet.

According to the present invention, there is also provided a printed wiring board, wherein when the via hole and/or the penetration hole is made in a double-side copper-clad board and its copper foils by direct irradiation with a carbon dioxide gas laser by means of the pulse oscillation of a carbon dioxide gas laser having an energy sufficient for removing the copper foils, the penetration hole and/or the blind via hole of the above printed wiring board are made by carrying out an oxidation treatment to form a metal oxide or a treatment with a chemical on one copper foil surface of the double-side copper-clad board or disposing, as an auxiliary material for making a hole, a layer of a resin composition containing 3 to 97% by volume of at least one powder selected from the group consisting of a carbon powder, metal powder, a metal compound powder having a melting point of at least 900° C. and a bond energy of at least 300 KJ/mol, on the above copper foil surface, and then directly irradiating the treated copper foil surface or the auxiliary material with a carbon dioxide gas laser.

According to the present invention 2, there are also provided a high relative-permittivity prepreg which is obtained by sandwiching an inorganic substrate or an organic fiber fabric substrate between the above high relative permittivity B-staged sheets and integrating these and its production process.

According to the present invention, there is also provided a high relative-permittivity prepreg, wherein the above inorganic substrate is a glass fiber non-woven fabric having a thickness of 100 μm or less and containing at least 90% by weight of a flat glass fiber of which the cross section is flat and in which a flatness rate, represented by the length/breadth of the cross section, is 3.1/1 to 5/1, the cross sectional area is 90 to 98% of the area of a rectangle circumscribing the glass fiber cross section, and a converted fiber diameter is 5 to 17 μm.

According to the present invention, there is also provided a high relative-permittivity prepreg, wherein the above inorganic substrate is a ceramic fiber substrate having a relative permittivity of at least 50.

According to the present invention, there is also provided a high relative-permittivity prepreg, wherein the above organic fiber fabric substrate is an aromatic polyester fiber non-woven fabric.

According to the present invention 2, there is also provided a printed wiring board obtained by making a penetration hole and/or a blind via hole in a copper-clad board comprising the above high relative permittivity prepreg.

DETAILED DESCRIPTION OF THE INVENTION

The high relative-permittivity B-staged sheet of the present invention 1 can be formed in an insulation sheet or copper-foil-attached sheet having a thickness of 50 μm or less, and the so-obtained insulation sheet or the copper-foil-attached sheet may be used to prepare a printed wiring board. This printed wiring board has a high heat-resistance and a high relative permittivity, it is excellently suitable for making a hole having a small diameter with a carbon dioxide gas laser, it is excellent in adhesion strength to a copper foil, and it is excellent in reliability. Of course, it is possible to produce a sheet having a thickness of at least 50 μm.

The present invention 1 provides a high relative-permittivity B-staged sheet in which an insulating inorganic filler having a relative permittivity of at least 500 at room temperature is incorporated into a solvent-less resin component so as to have a insulating inorganic filler content of 80 to 99% by weight.

The above solvent-less resin component refers to a resin component which contains, as an essential component, a resin composition obtained by incorporating 50 to 10,000 parts by weight of an epoxy resin (b) that is liquid at room temperature into 100 parts by weight of a monomer of a polyfunctional cyanate ester and/or a prepolymer of said cyanate ester (a) and incorporating 0.005 to 10 parts by weight of a heat-curing catalyst per 100 parts by weight of the total amount (a+b) of the monomer of the cyanate ester and/or the prepolymer of said cyanate ester and the epoxy resin.

According to the present invention 1, there can be provided a high relative-permittivity B-staged sheet having a relative permittivity of at least 50 as a cured sheet and a B-staged-sheet-attached copper foil. Further, the present invention can provide a printed wiring board which uses a copper-clad board of the high relative-permittivity B-staged sheet as a condenser or the like.

When the inorganic filler is incorporated in a large amount, particularly in an amount of 80% by weight or more, a defect such as deterioration of copper-foil adhesion strength occurs. According to conventional propositions, therefore, there is developed no copper-foil-attached B-staged sheet in which the inorganic filler is incorporated in a large amount. In the present invention, in order to produce a copper-clad laminate having a relative permittivity of particularly at least 50 and retaining the copper foil adhesion strength and a printed wiring board comprising it, an inorganic filler having a relative permittivity of at least 500, preferably at least 1,000, at room temperature is used, and as a resin, a liquid resin which is easily formed in a sheet and a polyfunctional cyanate ester compound for retaining characteristic properties are used. After the incorporation of these components, these components are uniformly mixed and dispersed to form a sheet or the resultant mixture is bonded to one surface of a copper foil to obtain a copper-clad sheet.

The polyfunctional cyanate ester compound used in the present invention refers to a compound having at least 2 cyanato groups per molecule. Specific examples thereof include 1,3- or 1,4-dicyanatobenzene, 1,3,5-tricyanatobenzene, 1,3-, 1,4-, 1,6-, 1,8-, 2,6- or 2,7- dicyanatonaphthalene, 1,3,6-tricyanatonaphthalene, 4,4-dicyanatobiphenyl, bis(4-dicyanatophenyl)methane, 2,2-bis(4-cyanatophenyl)propane, 2,2-bis(3,5-dibromo-4-cyanatophenyl)propane, bis(4-cyanatophenyl)ether, bis(4-cyanatophenyl)thioether, bis(4-cyanotophenyl)sulfone, tris(4-cyanatophenyl)phosphite, tris(4-cyanatophenyl)phosphate, and cyanates obtained by a reaction between novolak and cyan halide.

In addition to the above compound, there may be used polyfunctional cyanate ester compounds disclosed in Japanese Patent Publications Nos. 41-1928, 43-18468, 44-4791, 45-11712, 46-41112 and 47-26853 and JP-A-51-63149. Further, there may be used a prepolymer having a molecular weight of 400 to 6,000 and having a triazine ring formed by trimerizing cyanato group of any one of these polyfunctional cyanate ester compounds. The above prepolymer is obtained by polymerizing the above polyfunctional cyanate ester monomer in the presence of an acid such as a mineral acid or a Lewis acid, a base such as sodium alcoholate or tertiary amine, or a salt such as sodium carbonate as a catalyst. The prepolymer partially contains unreacted monomer and is in the form of a mixture of a monomer and a prepolymer, and the prepolymer in the above form is also suitably used in the present invention. Generally, it is dissolved in an organic solvent in which it is soluble, before use.

The epoxy resin which is liquid at room temperature is generally selected from known epoxy resins. Specific examples thereof include a bisphenol A type epoxy resin, a bisphenol F type epoxy resin, a phenol novolak type epoxy resin, a diglycidyl-modified polyether polyol, an epoxidized acid anhydride, and an alicyclic epoxy resin. These resins may be used alone or in combination. The amount of the resin per 100 parts by weight of a monomer of a polyfunctional cyanate ester and/or a prepolymer of said cyanate ester is 50 to 10,000 parts by weight, preferably 100 to 500 parts by weight.

Various additives may be added to the thermosetting resin composition in the present invention as required so long as the inherent properties of the composition are not impaired. The above additives include monomers having polymerizable double bonds such as unsaturated polyester, prepolymers of these, liquid elastic rubbers having a low molecular weight or elastic rubbers having a high molecular weight such as polybutadiene, epoxidized butadiene, maleated butadiene, a butadiene-acrylonitrile copolymer, polychloroprene, a butadiene-styrene copolymer, polyisprene, butyl rubber, fluorine rubber and natural rubber, polyethylene, polypropylene, polybutene, poly-4-methylpentene, polystyrene, AS resin, ABS resin, MBS resin, styrene-isoprene rubber, a polyethylene-propylene copolymer, a 4-fluoroethylene-6-fluoroethylene copolymer, high-molecular-weight prepolymers or oligomers such as polycarbonate, polyphenylene ether, polysulfone, polyester and polyphenylene sulfide, and polyurethane. These additives are properly used. Further, various known additives such as an inorganic or organic filler, a dye, a pigment, a thickener, a lubricant, an anti-foamer, a dispersing agent, a leveling agent, a photo-sensitizer, a flame retardant, a brightener, a polymerization inhibitor and a thixotropic agent may be used alone or in combination as required. A curing agent or a catalyst is incorporated into a compound having a reactive group as required.

The thermosetting resin composition used in the present invention undergoes curing itself under heat. However, since its curing rate is low, it is poor in workability and economic performances, etc., and a known heat-curing catalyst is incorporated into the thermosetting resin. The amount of the catalyst per 100 parts by weight of the total amount of the polyfunctional cyanate ester component and the epoxy resin component is 0.005 to 10 parts by weight, preferably 0.01 to 5 parts by weight.

The insulating inorganic filler used in the present invention refers to an insulating inorganic filler powder having a relative permittivity of at least 500 at room temperature, a particle diameter width of preferably 3 to 50 $\mu$m, an average particle diameter of preferably 4 to 30 $\mu$m and a BET specific surface area of preferably 0.30 to 1.00 m$^2$/g, more preferably 0.35 to 0.60 m$^2$/g. When the average particle diameter is smaller than the lower limit of the above range, the problem is that the copper foil adhesion strength is decreased. When the particle diameter is larger than the upper limit of the above range, the problem is that it is impossible to prepare a thin B-staged sheet or that the inorganic filler is settled down at a time of preparing a sheet so that an obtained sheet is uneven. When the inorganic filler is incorporated in a large amount, particularly in an amount of 80% by weight or more, there is caused a defect that the copper foil adhesion strength is decreased. Therefore, according to conventional propositions, there is developed no copper-clad laminate in which the inorganic filler is incorporated in a large amount. According to the present invention, there can be produced a copper-clad laminate having a relative permittivity of particularly at least 20, preferably at least 50, and retaining the copper foil adhesion strength and a printed wiring board comprising it owing to the use of the insulating inorganic filler having the above characteristic properties.

The inorganic filler used in the present invention is particularly preferably a titanic acid compound-containing ceramic. Specifically, it includes a barium titanate-containing ceramic, a strontium titanate-containing ceramic, a lead titanate-containing ceramic, a magnesium titanate-containing ceramic, a calcium titanate-containing ceramic, a bismuth titanate-containing ceramic, and a lead zirconate-containing ceramic concerning a composition of these, any one of these ceramics may be formed of each component alone or may be formed of each component and small amounts of other additives, while the crystal structure of a main component is retained. These are used alone or in combination. There may be used materials obtained by sintering any one of the above ceramics or at least two ceramics and pulverizing the sintered ceramic(s). The amount of the inorganic filler is 80 to 99% by weight, preferably 85 to 95% by weight, based on the total.

The components used in the present invention may be uniformly kneaded by a generally known method. For example, the components are mixed and the mixture is kneaded with a three-roll at room temperature or under heat. Otherwise, there is used a generally known machine such as a ball mill, a mixer, or a homomixier. In some cases, a solvent is added for adjusting its viscosity to a viscosity suited for a processing method.

The kneaded mixture is formed in a sheet with a roll under pressure. Otherwise, the kneaded mixture is extruded and bonded to one surface of a copper foil to obtain a copper-foil attached B-staged sheet. The thickness of the sheet is a predetermined thickness, preferably 50 $\mu$m or less. Further, there may be employed a method in which a solvent is partially added to the kneaded mixture to obtain a viscous solution, the viscous solution is applied to a release film or a copper coil surface by a knife coating method or the like to form a layer having a predetermined thickness, and the layer is dried to form a sheet.

The copper foil used in the present invention is not specially limited, while an electrolytic copper foil having a thickness of 3 to 18 $\mu$m is preferably used.

In conditions for the laminate-formation of the copper-clad board used in the present invention, the temperature therefor is generally 150 to 250° C., the pressure therefor is generally 5 to 50 kgf/cm², and the time period therefor is generally 1 to 5 hours. Further, the laminate-formation is preferably carried out in vacuum.

According to the present invention 2, there is provided a high relative-permittivity prepreg obtained by sandwiching an inorganic substrate or an organic fiber fabric substrate between the high relative-permittivity B-staged sheets recited in the present invention 1 and integrating these without impairing the B-staged condition.

Since the prepreg is reinforced with the substrate, the prepreg has a higher strength than prepreg containing no substrate so that the above prepreg is excellent in resistance to dimensional changes after molding. Further, it is also possible to obtain a high relative-permittivity prepreg having a relative permittivity of at least 20. A copper-clad laminate obtained by the use of the above prepreg is excellent in adhesion to a copper foil and high heat resistance, and holes having a small diameter are excellently made in the copper-clad laminate with a carbon dioxide gas laser. A printed wiring board to which the above copper-clad laminate is applied is excellent in electrical insulation properties after moisture absorption and anti-migration properties and also excellent in reliability with regard to connection.

The present invention 2 provides a process for the production of a high relative-permittivity prepreg, in which a thermosetting resin composition containing 80 to 99% by weight of an insulating inorganic filler powder having a relative permittivity of at least 500 at room temperature is processed to form B-staged sheets, an inorganic substrate or an organic fiber fabric substrate is sandwiched between the B-staged sheets, release films are disposed thereon, one on one surface and one on the other surface, or a copper foil is disposed on at least one surface thereof, and these materials are integrated without impairing the B-staged condition to obtain a high relative-permittivity prepreg. According to the present invention 2, there is also provided a copper-foil attached prepreg. Of course, at least two B-staged sheets can be placed on one surface of the substrate. However, the thickness of a so-obtained prepreg becomes too thick. It is therefore preferred to place one B-staged sheet on one surface of the substrate and one B-staged sheet on the other surface.

Figure 1:
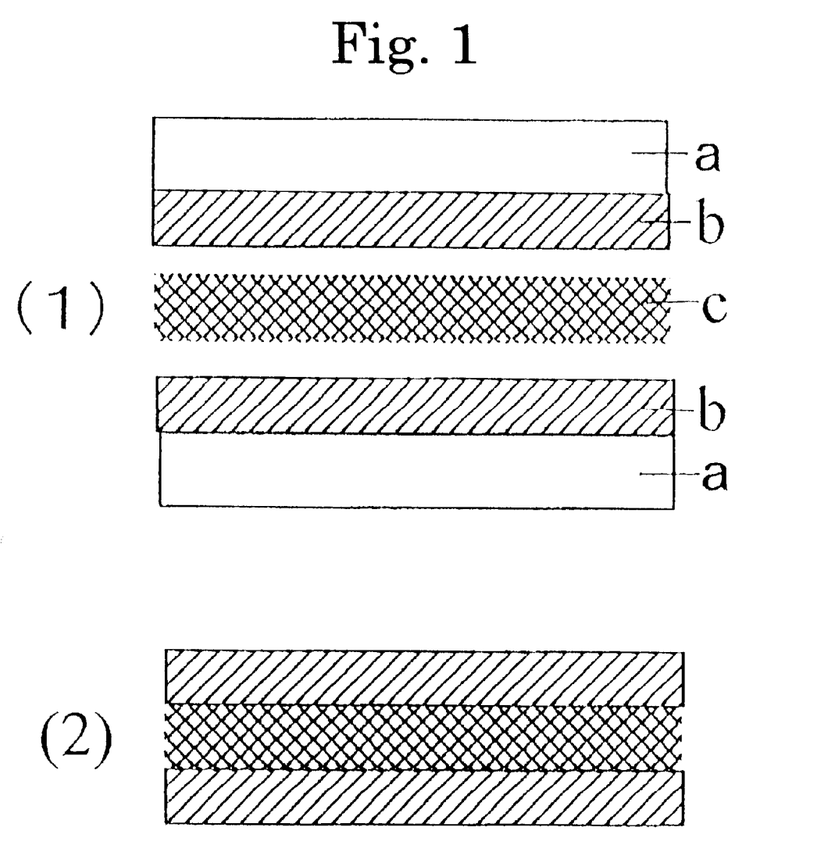
FIG. 1 shows steps of producing a high relative-permittivity prepreg (2) of the present invention.

As a method of preparing the prepreg, for example, there may be employed a method in which one surface of a B-staged sheet is covered with a release film, two of such a sheet are provided, a substrate is sandwiched between these two B-staged sheets such that the resin layer surface of each B-staged sheet, which resin layer surface is opposite to the release-film-attached surface, faces to the substrate, and these materials are integrated under pressure with a roll or a press which is heated up to preferably a temperature at which the B-staged condition can be maintained, to form a prepreg containing the substrate (FIG. 1(1), (2)). Although not specially limited, the temperature therefor is generally 80 to 150° C. and the pressure therefor is generally 5 to 20 kgf/cm as a linear pressure. Symbols in FIG. 1 attached to the present specification have the following meanings; a: a polyethylene terephthalate film, b: a B-staged sheet having a high relative permittivity, and c: an inorganic substrate.

At least one sheet of the prepreg of the present invention is provided, a copper-foil, preferably an electrolytic copper foil, is placed on at least one surface of the prepreg, and the resultant set is laminate-formed under heat under pressure, to obtain a copper-clad board. The above copper foil is not specially limited, while an electrolytic copper foil having a thickness of 3 to 18 µm is preferably used. In conditions for the laminate-formation of the copper-clad board containing the prepreg of the present invention, the temperature therefor is generally 150 to 250° C., the pressure therefor is generally 5 to 50 kgf/cm², and the time period therefor is generally 1 to 5 hours. Further, the laminate-formation is preferably carried out in vacuum.

The substrate can be selected from generally known inorganic substrates. For example, there are used a glass fiber woven fabric, a glass fiber non-woven fabric, a ceramic fiber woven fabric and a ceramic fiber non-woven fabric. A fabric having a higher relative permittivity is preferred. Since the woven fabric has a large density, the prepreg is increased in relative permittivity. However, it is impossible for decreasing the thickness of the prepreg that a larger amount of a resin composition containing the inorganic filler is attached to the woven fabric. Therefore, the non-woven fabric is preferred. Of course, there may be also suitably used a woven fabric having a decreased density and having plenty of spaces.

As a glass fiber non-woven fabric, there is used a glass fiber non-woven fabric having a thickness of 100 µm or less, preferably 50 µm or less, and containing at least 90% by weight of a flat glass fiber of which the cross section is flat and in which a flatness rate, represented by the length/breadth of the cross section, is 3.1/1 to 5/1, the cross sectional area is 90 to 98% of the area of a rectangle circumscribing the glass fiber cross section, and a converted fiber diameter is 5 to 17 µm. Owing to the use of the above glass fiber non-woven fabric, the thickness of the prepreg can be decreased. More preferably, when a ceramic fiber fabric having a relative permittivity of at least 50, preferably at least 500, is used as the above inorganic substrate, the relative permittivity of the prepreg can be further increased. The "converted fiber diameter" refers to a diameter calculated as a circle from the cross section area of a fiber.

According to the present invention 2, there is also provided a prepreg obtained by providing an organic fiber fabric as a substrate, forming a layer of a thermosetting resin composition containing a thermosetting resin and 80 to 99% by weight of an insulating inorganic filler having a relative permittivity of at least 500 at room temperature on one surface of a thermoplastic resin film, placing the resultant thermoplastic resin films on both the surfaces of the organic fiber fabric, one on one surface one on the other surface, so as to allow the resin layer surface of each thermoplastic resin film to face the organic fiber fabric side, melting the resin layers under heat under pressure to bond the resin layers to the middle organic fiber fabric. Further, the present invention provides a printed wiring board using a copper-clad board obtained from the prepreg. The above printed wiring board is excellent in copper-foil-adhesion strength and has a high mechanical strength, a high heat-resistance and a high relative permittivity. Further, a small-diameter hole can be excellently made in the above printed wiring board with a carbon dioxide gas laser, and the above printed wiring board is excellent in reliability with regard to connection.

The organic fiber fabric substrate is not specially limited. However, there are preferably used non-woven fabrics and woven fabrics of a liquid crystal polyester fiber, a polybenzazole fiber and a wholly aromatic polyamide fiber. Particularly, the liquid crystal polyester non-woven fabric is preferably used in view of the formation of a hole with a mechanical drill or a carbon dioxide gas laser. When the non-woven fabric is used, there may be used a non-woven fabric obtained by attaching a binder to fibers for connecting the fibers to each other or a non-woven fiber disclosed in JP-A-11-255908 in which a fiber having a low polymerization degree is mixed with a fiber having a high polymerization degree, the fiber having a low polymerization degree is melt under heat at a temperature of about 300° C. and the melt fiber having a low polymerization degree is used in place of the binder. When the binder is used, the amount of the binder is not specially limited. However, the binder is attached preferably in an amount of 3 to 8% by weight in order to maintain the strength of the non-woven fabric.

The method of preparing prepreg by forming a resin layer on an organic substrate surface is as follows. An insulating inorganic filler is added to a resin composition, a solvent is added thereto as required to obtain a varnish, the varnish is applied to one surface of a release film, the varnish is dried to obtain a B-staged sheet, the B-staged sheets are placed on the both the surface of the organic substrate, one on one surface one on the other surface, so as to allow the resin layer surface of each B-staged sheets to face the substrate, and these materials are laminated and integrated with a heating and pressure roll or the like to obtain a B-staged prepreg.

A copper foil, preferably an electrolytic copper foil, is placed on at least one surface of the so-obtained prepreg and the resultant set is laminate-formed under heat and pressure to obtain a copper-clad laminate. The above copper foil is not specially limited. However, when the copper-clad laminate is a double-side copper-clad board, the copper foils preferably have a thickness of 3 to 18 $\mu$m. When the copper-clad laminate is used as an internal board, there is preferably used an electrolytic copper foil having a thickness of 9 to 35 $\mu$m.

A hole can be made in the B-staged sheet of the present invention or the copper-clad laminate obtained by using the B-staged sheet with a mechanical drill. Since, however, the inorganic filler is contained in a large amount so that the drill wears out considerably, it is preferred to make a hole with a laser. In view of a processing speed, it is preferred to use a carbon dioxide gas laser. The method of making a hole with a carbon dioxide gas laser is not specially limited. However, an auxiliary material is placed on the copper-clad laminate and the auxiliary material is directly irradiated with a high-energy carbon dioxide gas laser, whereby a penetration hole and/or a blind via hole can be easily formed. When the penetration hole and/or the blind via hole is made, copper foil burrs remain around the hole. The copper foil burrs may be removed by mechanical polishing, while it is impossible to remove the copper foil burrs completely. In a case of thick copper foils having a thickness of 9 to 12 $\mu$m, preferred is a method in which the surface copper foils are etched in the thickness direction with a chemical until each of the copper foils has a remaining thickness of 2 to 7 $\mu$m and concurrently the copper foil burrs occurring around the hole are etched and removed. Thereafter, copper plating is carried out and circuits are formed on the front and reverse surfaces of the copper-clad laminate, to obtain a printed wiring board. For preparing a multi-layered laminate, a multi-layered copper-clad board obtained by surface-treating at least one surface of the above printed wiring board with copper, disposing prepreg and a copper foil thereon, and laminate-forming the resultant set is provided, and a hole which penetrates through the multi-layered copper-clad board from the front surface to the reverse surface preferably so as to finally connect the inner and outer copper foils to each other and/or a blind via hole is/are made, and the front-surface and reverse-surface copper foils are partially etched and removed with a chemical, followed by a through hole plating, a via hole plating, the formation of circuits on the front and reverse surfaces, optionally covering with a plating resist, and plating with a noble metal, to obtain a printed wiring board.

A hole may be made by a generally known hole-making method using an excimer laser, a YAG laser, a carbon dioxide gas laser or a mechanical drill. However, it is preferred to use a carbon dioxide gas laser in view of workability, the speed of making holes, and the reliability of a hole.

A penetration hole and/or a blind via hole having a diameter of 25 to 180 $\mu$m are generally made with a laser. A hole having a diameter in the range of from at least 25 $\mu$m to less than 80 $\mu$m is preferably made with an excimer laser or a YAG laser. For making a hole having a diameter of from at least 80 $\mu$m to 180 $\mu$m or less, a copper foil surface is treated to form a metal oxide layer or treated with a chemical, or a coating of a coating composition containing 3 to 97% by volume of at least one powder of a carbon powder, metal powder or a metal compound powder having a melting point of at least 900° C. and a bond energy of at least 300 kJ/mol or a sheet obtained by applying the coating composition to a thermoplastic film is formed or disposed on the copper foil surface so as to have a total thickness of preferably 30 to 200 $\mu$m. Then, the resultant copper foil surface is directly irradiated with a carbon dioxide gas laser at an output energy of 20 to 60 mJ to form a penetration hole for a through hole. After the hole is made, the copper foil surfaces may be mechanically polished to remove burrs. For removing the burrs completely, however, preferably, the surfaces of both the surface copper foils are etched two-dimensionally to remove part of each copper foil in the thickness direction, whereby the copper foil burrs occurring in the hole portions are also etched and removed. In this case, further, the thickness of each surface copper foil is decreased. In the following formation of a circuit of narrow lines on the front and reverse copper foils obtained by metal plating, therefore, defects such as a short circuit and a pattern breakage do not occur, and a high-density printed wiring board can be produced. When the front-surface and reverse-surface copper foils are decreased in the thickness by etching, preferably, a resin layer which is attached to an inner-layer copper foil surface exposed in the inside of a hole is preferably treated at least in a gaseous phase and then removed by etching. At least 50% by volume of the inside of a hole may be filled with a copper plating.

When the initial thickness of copper foil is thin or 3 to 7 $\mu$m, auxiliary materials are attached to the front-surface and reverse-surface copper foils, the upper surface is directly irradiated with a carbon dioxide gas laser to make a penetration hole and/or a blind via hole, then, the auxiliary materials are retained as they are, copper foil burrs of the surface layers and the inner layers are dissolved and removed by blowing an etching solution or sucking the etching solution through the hole, then, the auxiliary material layers on the surfaces are removed, a desmearing treatment is carried out as required, and a copper is attached by plating. The processing rate of making a hole with a carbon dioxide gas laser is remarkably high as compared with the processing rate with a drill, and the present invention is therefore excellent in productivity and also excellent in economic performances. When a penetration hole having a diameter of 180 $\mu$m or more is made, the hole is made by the use of an excimer laser, a YAG laser, or a mechanical drill. Preferably, the hole is made with a mechanical drill.

The metal compound having a melting point of at least 900° C. and a bond energy of at least 300 kJ/mol, used in an auxiliary material in the present invention, can be selected from generally known metal compounds. Specific examples thereof include oxides. The oxides include titanias such as titanium oxide, magnesias such as magnesium oxide, oxides of iron such as iron oxide, oxides of nickel such as nickel oxide, manganese dioxide, oxides of zinc such as zinc oxide, silicon dioxide, aluminum oxide, rare earth metal oxides, oxides of cobalt such as cobalt oxide, oxides of tin such as tin oxide and oxides of tungsten such as tungsten oxide. Further, non-oxides may be used. The non-oxides include generally known non-oxides such as silicon carbide, tungsten carbide, boron nitride, silicon nitride, titanium nitride, aluminum nitride, barium sulfate and rare earth metal sulfides. Further, various glasses which are mixtures of these metal oxide powders may be also used.

The carbon powder and the metal powder includes powders of simple substances of silver, aluminum, bismuth, cobalt, copper, iron, magnesium, manganese, molybdenum, nickel, palladium, antimony, silicon, tin, titanium, vanadium, tungsten and zinc or metals powders of alloys of these. These are used alone or in combination. The particle diameter of these is not specially limited, while it is preferably 1 $\mu$m or less.

When irradiated with a carbon dioxide gas laser, molecules are dissociated or melted to be dissipated. Preferred are therefore those which have no detrimental effect on a semiconductor chip or adhesion properties of a hole wall when they adhere to the hole wall, and the like. A powder containing Na, K or Cl ion is not preferred since it has a detrimental effect on the reliability of a semiconductor in particular. The amount of the above powder is 3 to 97% by volume, preferably 5 to 95% by volume. Preferably, the above powder is incorporated into a water-soluble resin and homogeneously dispersed.

The water-soluble resin in an auxiliary material is not specially limited, while it is selected from those which are not peeled off when kneaded, applied to a copper foil surface and dried or formed in a sheet. For example, it is selected from generally known resins such as polyvinyl alcohol, polyester, polyether and starch.

The method of preparing composition containing a metal compound powder, a carbon powder or metal powder and a resin is not critical. The above method includes generally known methods such as a method of kneading materials without any solvent at a high temperature with a kneader and extruding the kneaded mixture in the form of a sheet to bond it to a thermoplastic film surface, and a method of dissolving a water-soluble resin in water, adding the above powder thereto, homogeneously mixing them with stirring, applying the mixture as a coating composition to a thermoplastic film surface and drying it to form a coating. The thickness of the sheet or the coating is not specially limited, while it has a total thickness of 30 to 200 $\mu$m.

Further, it is also possible to treat a copper foil surface to form a metal oxide and then make holes similarly. The above treatment is not specially limited, while it includes, for example, an oxidation treatment to form a black copper oxide and a MM treatment (supplied by Mac Dermid). Further, as a treatment with a chemical, for example, a CZ treatment (supplied by Meck K.K.) is preferably used. In view of the form of the holes, however, it is preferred to use the above auxiliary material.

It is preferred to dispose a backup sheet formed by attaching a water-soluble resin to a metal plate on the reverse surface of the copper-clad-board so as not to impair the table of a carbon dioxide gas laser when the penetration hole is made.

The auxiliary material is applied on a copper foil surface to form a coating or the auxiliary material is applied onto a thermoplastic film to form a sheet. When the auxiliary material sheet and the backup sheet are laminated on copper foil surfaces under heat and pressure, the applied resin layer of the auxiliary material sheet is attached to one of the surface copper foils, the applied resin layer of the backup sheet is also attached to the other surface copper foil, and the auxiliary material sheet and the backup sheet are laminated on the copper foil surfaces with a roll by melting the resin layers at a temperature of generally 40° C. to 150° C., preferably 60° C. to 120° C. at a linear pressure of generally 0.5 to 20 kg, preferably 1 to 10 kg, to bond the resin layers to the surface copper foils closely. The temperature to be selected differs depending upon the melting point of a selected water-soluble resin and also differs depending upon a selected linear pressure and a laminating rate. Generally, the lamination is carried out at a temperature higher than the melting point of the water-soluble resin by 5 to 20° C.

When a hole having a diameter of 80 to 180 $\mu$m is made with a carbon dioxide gas laser by its irradiation with an output energy of preferably 20 to 60 mJ, burrs occur around the hole. The occurrence of the burrs is not a special problem, when the hole is made in a double-side copper-clad laminate having thin copper foils cladded. In this case, there may be employed a method in which a resin remaining on a copper foil surface is removed by a gaseous phase treatment or a liquid phase treatment, the inside of the hole, as it is, is plated with copper to fill at least 50% by volume of the hole inside with a copper plating, and at the same time the surfaces are also plated with copper to have a copper foil thickness of 18 $\mu$m or less. However, preferred is a method in which an etching solution is blown to a hole portion or the etching solution is sucked through the hole portion to dissolve and remove the copper foil burrs existing in the hole portion and concurrently to etch the surface copper foils so as to have a thickness of 2 to 7 $\mu$m each, preferably 3 to 5 $\mu$m, and then a copper plating is carried out. In this case, etching with a chemical is more preferred than mechanical polishing in view of the removal of the burrs on the hole portion and the prevention of dimensional changes caused by the polishing.

In the present invention, the method of removing the copper burrs occurring on the hole portion by etching is not specially limited, and it includes methods of dissolving and removing a metal surface with a chemical (called a SUEP method) disclosed, for example, in JP-A-02-22887, JP-A-02-22896, JP-A-02-25089, JP-A-02-25090, JP-A-02-59337, JP-A-02-60189, JP-A-02-166789, JP-A-03-25995, JP-A-03-60183, JP-A-03-94491, JP-A-04-199592 and JP-A-04-263488. The etching is generally carried out at a rate of 0.02 to 1.0 $\mu$m/second.

A carbon dioxide gas laser generally uses a wavelength of 9.3 to 10.6 $\mu$m in an infrared wavelength region. A copper foil is processed at its output of preferably 20 to 60 mJ to make a hole. An excimer laser generally uses a wavelength of 248 to 308 nm and a YAG laser generally uses a wavelength of 351 to 355 nm, while the wavelengths of these laser are not limited to the above wavelengths. The processing rate with a carbon dioxide gas laser is remarkably high so that the use of a carbon dioxide gas laser is excellent in economic performances.

When the penetration hole is made, there may be employed a method in which irradiation is carried out with an energy selected from 20 to 60 mJ from beginning to end, or a method in which the energy is changed in the formation of a hole to make a hole. When the surface copper foil is removed, it is efficient to select a higher energy since the number of shots to be irradiated can be decreased. When a middle resin layer is processed, a high output is not necessarily required. The output may be properly selected depending upon the substrate and the resin. For example, there may be selected an output of 10 to 35 mJ. Of course, a high output may be used to the end of the processing. Conditions of making the holes may be varied depending upon whether or not a copper foil as an inner layer is present inside the hole.

In the majority of cases, a resin layer having a thickness of about 1 $\mu$m remains on a copper foil as an inner layer inside a hole made with a carbon dioxide gas laser. When a hole is made with a mechanical drill, a smear remains in some cases. When the above resin layer is removed, therefore, the reliability of connection between a copper plating and coppers of the outer and inner layers is further improved. The resin layer may be removed by a generally known treatment such as a desmearing treatment. However, when a solution does not reach into the inside of a small-diameter hole, the remains of the resin layer remaining on the inner layer copper foil surface occur, which cause a failure in connection to the copper plating in some cases. Therefore, more preferably, first, the inside of a hole is treated in a gaseous phase to remove the remaining resin layer completely and then the inside of a hole is wet-treated preferably in combination with the use of ultrasonic. The gaseous phase treatment can be selected from generally known methods such as a plasma treatment and a treatment with low ultraviolet light. The plasma treatment uses low-temperature plasma prepared by partially exciting and ionizing molecules with a high-frequency power source. In the plasma treatment, a high-rate treatment using ionic impact or a moderate treatment with radical species is generally used. As a processing gas, a reactive gas or an inert gas is used. As a reactive gas, oxygen is mainly used, and a surface is chemically treated. As an inert gas, argon gas is mainly used. Physical surface treatment is carried out with argon gas, or the like. The physical treatment cleans a surface with an ionic impact. The low ultraviolet light is ultraviolet light in a short wavelength region. The resin layer is decomposed and removed by irradiation with ultraviolet light in a short wavelength region having a peak at 184.9 nm or 253.7 nm. Then, the resin surface becomes hydrophobic in most cases. Therefore, particularly in a case of a small-diameter hole, it is preferred to carry out a wet-treatment in combination with the use of ultrasonic, and then carry out a copper plating. The wet-treatment is not specially limited, while it includes a treatment with a potassium permanganate aqueous solution or an aqueous solution for soft etching.

EFFECT OF THE INVENTION

According to the present invention, there is provided a high relative-permittivity B-staged sheet obtained by uniformly incorporating an insulating inorganic filler having a relative permittivity of at least 500 at room temperature into a solvent-less component so as to have an insultaing inorganic filler content of 80 to 99% by weight, preferably 85 to 95% by weight, the solvent-less component being preferably a solvent-less resin component containing, as an essential component, a resin composition obtained by incorporating 50 to 10,000 parts by weight of an epoxy resin (b) liquid at room temperature into 100 parts of (a) a monomer of a polyfunctional cyanate ester and/or a prepolymer of said cyanate ester and adding 0.005 to 10 parts by weight of a heat-curing catalyst per 100 parts of the components (a+b). The above high relative-permittivity B-staged sheet is used to prepare a copper-clad laminate, and a printed wiring board to which the copper-clad laminate is applied is excellent in heat resistance, adhesion properties to a copper foil, and electrical insulation properties after moisture absorption. Further, the above printed wiring board has a relative permittivity of at least 50 and is practicable as a condenser. Further, owing to the use of the auxiliary material on the copper-clad laminate, it is possible to directly make a hole having a small diameter by irradiation with a high-energy carbon dioxide gas laser, and there is obtained a high-density printed wiring board.

When an inorganic substrate or an organic fiber fabric substrate is disposed between the above B-staged sheets and these materials are integrated to prepare a high relative-permittivity prepreg, there can be obtained a prepreg in which a resin composition containing a large amount of an inorganic filler is attached to a substrate. Further, a material obtained by providing the above solvent-less resin component as a thermosetting resin and incorporating an insulating inorganic filler having a relative permittivity of at least 500 at room temperature and a specific surface area of 0.30 to 1.00 m$^2$/g into the solvent-less resin component is processed to prepare a copper-clad laminate. A printed wiring board to which the above copper-clad laminate is applied is excellent in heat resistance, adhesion properties to a copper foil, and electrical insulation properties after moisture absorption. Further, the above printed wiring board has a relative permittivity of at least 20 and is practicable as a condenser. Further, owing to the use of the auxiliary material on the copper-clad laminate, it becomes possible to directly make a penetration hole and/or a blind via hole having a small diameter by irradiation with a high-energy carbon dioxide gas laser. Then, copper foil burrs occurring around the holes are removed with a chemical and concurrently surface copper foils are removed in the thickness direction to some extent, whereby there is obtained a high-density printed wiring board.

EXAMPLES

The present invention will be specifically explained with reference to Examples and Comparative Examples hereinafter, in which "part" stands for "part by weight" unless otherwise specified.

Examples 1 to 6

1,000 parts of 2,2-bis(4-cyanatophenyl)propane monomer (component A-1) was melted at 150° C., and allowed to react with stirring for 4 hours, to give a prepolymer (component A-2) having an average molecular weight of 1,900. A bisphenol A type epoxy resin (trade name: Epikote 828, supplied by Yuka-Shell Epoxy K.K., component B-1), a bisphenol F type epoxy resin (trade name: EXA830LVP, supplied by Dainippon ink and chemicals, inc., component B-2) and/or a novolak type epoxy resin (trade name: DEN431, supplied by Dow Chemical, component B-3) as epoxy resins in a liquid state at room temperature were added. Iron acetylacetonate (component C-1) and 2-ethyl-4-methylimidazole (component C-2) as heat-curing catalysts and an epoxy silane coupling agent (trade name: A-187, supplied by Nihon Yunika K.K., component D-1) as an additive were added to the resultant mixture to obtain a varnish. As an inorganic filler, a barium titanate-containing ceramic (relative permittivity at 1 MHz at room temperature: 2010, BET specific surface area: 0.41 m$^2$/g, component E-1), a bismuth titanate-containing ceramic (relative permittivity at room temperature: 733, BET specific surface area: 0.52 m$^2$/g, component E-2) or a barium titanate-calcium stannate-containing ceramic (relative permittivity at room temperature: 5020, BET specific surface area: 0.45 m²/g, a pulverized sintered-substance, component E-3) was added to the varnish. The above components were incorporated in amounts as shown in Table 1 and Table 2. The mixture was uniformly kneaded with a mixer for 10 minutes. The kneaded mixture was extruded on one surface of a 12 μm thick electrolytic copper foil to form a layer having a thickness of 50 μm, whereby a sheet was prepared. Otherwise, a small amount of methyl ethyl ketone was added to the kneaded mixture, the resultant mixture was applied to an electrolytic copper foil surface, and the applied mixture was dried to remove the solvent and to form a resin-attached copper foil. A 12 μm thick electrolytic copper foil was placed on the resin layer of the above sheet or the resin-attached copper foil, and the resultant set was laminate-formed at 200° C. at 20 kgf/cm² under a vacuum of 30 mmHg or less for 2 hours, to give a double-side copper-clad board.

Separately, 800 Parts of a black copper oxide powder (average particle diameter 0.8 μm) as a metal oxide powder was added to a varnish of a polyvinyl alcohol powder in water, and these materials was homogeneously mixed. The resultant mixture was applied onto one surface of a 50 μm thick polyethylene terephthalate film to form a layer having a thickness of 30 μm, and the layer was dried at 110° C. for 30 minutes to obtain an auxiliary material F having a metal compound powder content of 45% by volume. The auxiliary material F was placed on the above double-side copper-clad board with the resin layer surface facing a copper foil side, the auxiliary material F was laminated on the copper foil surface at 100° C. Then, The auxiliary material surface was directly 4 shots irradiated with a carbon dioxide gas laser at an output of 30 mJ to make 44 penetration holes having a diameter of 100 μm for through holes in a central square area having a size of 6 mm×6 mm in a square area having a size of 20 mm×20 mm in each of 70 blocks. The surface copper foils were etched until the copper foils had a thickness of 3 μm each and burrs around the holes were also dissolved and removed, by a SUEP treatment. Copper plating was carried out to form a plating layer of 13 μm, and 95% by volume of the inside of each hole was filled with the copper plating. Circuits (line/space=50/50 μm), lands for solder balls, and the like were formed on both the surfaces of the board by conventional methods, portions other than at least a semiconductor chip mounting portion, pad portions and solder ball pad portions were coated with a plating resist, and nickel plating and gold plating were carried out to obtain a printed wiring board. Tables 3 and 4 show evaluation results.

Comparative Examples 1 to 3

2,000 parts of an epoxy resin (trade name: Epikote 5045, supplied by Yuka-Shell Epoxy K.K.) which was solid at room temperature, 70 parts of dicyandiamide and 2 parts of 2-ethylimidazole were dissolved in mixed solvents of methyl ethyl ketone and dimethylformamide, these materials were stirred and uniformly dispersed to obtain a varnish G (this solid was to be referred to as component A-3). To the varnish G added barium titanate (particle diameter 0.5 to 5 μm, BET specific surface area 0.89 m²/g, relative permittivity 2,010, component E-4) in amounts shown in Tables 1 and 2. The mixture was uniformly kneaded, a glass woven fabric having a thickness of 50 μm and a weight of 48 g/m² was impregnated with the above kneaded mixture, the mixture was dried to obtain a B-staged prepreg having a glass content of 35% by weight. The dried resin had no flexibility so that the resin was peeled off when bent. 12 μm thick electrolytic copper foils were placed on both the surfaces, one on one surface one on the other surface, and the resultant set was laminate-formed at 190° C. at 20 kgf/cm² under a vacuum of 30 mmHg or less for 2 hours, to give a double-side copper-clad laminate. Penetration holes having a diameter of 200 μm each were made in the double-side copper-clad laminate with a mechanical drill. Copper was generally plated to form a layer having a thickness of 10 μm on each surface without the SUEP treatment. The resultant double-side copper-clad laminate was processed to prepare a printed wiring board. Table 5 shows evaluation results.

Comparative Example 4

A titanium dioxide powder (relative permittivity 30, BET specific surface area 1.26 m²/g, Component E-5) was added to the same varnish G as that in Comparative Example 1, so as to have a titanium dioxide powder content of 90% by weight. These materials were sufficiently mixed with a mixer, the resultant mixture was applied to a copper foil to form a coating having a thickness of 40 μm, and the coating was dried to obtain a B-staged resin-attached copper foil. A 12 μm thick electrolytic copper foil was placed on the resin layer surface of the B-staged resin-attached copper foil, and the resultant set was laminate-formed under the same pressing conditions as those in Comparative Example 1. However, the flow of the resin was poor, and voids were found. Table 5 shows evaluation results.

TABLE 1

Unit: parts by weight

| Compo- | Examples | | | | | | Comparative Examples | | | |
|---|---|---|---|---|---|---|---|---|---|---|
| nents | 1 | 2 | 3 | 4 | 5 | 6 | 1 | 2 | 3 | 4 |
| A-1 | 15 | | 20 | | 25 | | | | | |
| A-2 | 13 | | 20 | | 20 | | | | | |
| A-3 | | | | | | | | | 100 | 100 |
| B-1 | | | 5 | | | | | | | |
| B-2 | 22 | | 10 | | 15 | | | | | |
| B-3 | 50 | | 45 | | 40 | | | | | |
| C-1 | 0.03 | | 0.03 | | 0.03 | | | | | |
| C-2 | 0.5 | | 0.5 | | 0.5 | | | | | |

TABLE 2

Unit: parts by weight

| Compo- | Examples | | | | | | Comparative Examples | | | |
|---|---|---|---|---|---|---|---|---|---|---|
| nents | 1 | 2 | 3 | 4 | 5 | 6 | 1 | 2 | 3 | 4 |
| D-1 | | 2 | | 2 | | 2 | | | | |
| E-1 | 567 | 1,328 | | | | | | | | |

TABLE 2-continued

Unit: parts by weight

| Components | Examples | | | | | | Comparative Examples | | | |
|---|---|---|---|---|---|---|---|---|---|---|
| | 1 | 2 | 3 | 4 | 5 | 6 | 1 | 2 | 3 | 4 |
| E-2 | | | 567 | 900 | | | | | | |
| E-3 | | | | | 567 | 900 | | | | |
| E-4 | | | | | | | 233 | 567 | 900 | |
| E-5 | | | | | | | | | | 900 |
| Particle diameter, μm | 3-41 | | 5-40 | | 3-42 | | 0.5-5 | | | 3-42 |

TABLE 3

| | Examples | | | | | |
|---|---|---|---|---|---|---|
| | 1 | 2 | 3 | 4 | 5 | 6 |
| Voids after laminate-formation | No | No | No | No | No | No |
| Copper foil adhesion strength, kgf/cm, 12 μm | 1.16 | 0.63 | 1.15 | 0.72 | 1.18 | 0.71 |
| Heat resistance for solder | No failure | No failure | No failure | No failure | No failure | No failure |
| Pattern breakage and short circuits (number of places) | 0/200 | 0/200 | 0/200 | 0/200 | 0/200 | 0/200 |
| Glass transition temperature (° C.) | | 180 | | 198 | | 221 |

TABLE 4

| | Examples | | | | | |
|---|---|---|---|---|---|---|
| | 1 | 2 | 3 | 4 | 5 | 6 |
| Through hole-heat cycle test, % | | | | | | |
| 15.0 cycles | 2.0 | 2.2 | 2.3 | 2.4 | 1.9 | 2.1 |
| Relative permittivity, 1 MHz | 55 | 107 | 14 | 30 | 67 | 131 |
| Insulation resistance value after pressure cooker treatment, Ω | | | | | | |
| Normal state | — | $5 \times 10^{14}$ | — | $3 \times 10^{14}$ | — | $7 \times 10^{14}$ |
| 200 hrs. | | $7 \times 10^{10}$ | | $4 \times 10^{10}$ | | $5 \times 10^{10}$ |
| Anti-migration properties, Ω | | | | | | |
| Normal state | — | $5 \times 10^{13}$ | — | $3 \times 10^{13}$ | — | $6 \times 10^{13}$ |
| 200 hrs. | | $2 \times 10^{11}$ | | $1 \times 10^{11}$ | | $3 \times 10^{11}$ |
| 500 hrs. | | $8 \times 10^{10}$ | | $9 \times 10^{10}$ | | $1 \times 10^{11}$ |

TABLE 5

| | Comparative Examples | | | |
|---|---|---|---|---|
| | 1 | 2 | 3 | 4 |
| Voids after laminate-formation | No | Voids partially occur | Voids occur to a great extent | Voids occur to a great extent |
| Copper foil adhesion strength, kgf/cm, 12 μm | 1.25 | 0.21 | — | — |
| heat resistance for solder | Swelling occurs | — | — | — |
| Pattern breakage and short circuits (number of places) | 51/200 | — | — | — |
| Glass transition temperature (° C.) | 135 | — | — | — |
| Through hole-heat cycle test, % | | | | |
| 150 cycles | 12.2 | — | — | — |
| Relative permittivity, 1 MHz | 8.0 | — | — | — |
| Insulation resistance value after pressure cooker treatment, Ω | | | | |
| Normal state | $5 \times 10^{14}$ | — | — | — |
| 200 hrs. | $< 10^{8}$ | | | |
| Anti-migration properties, Ω | | | | |
| Normal state | $6 \times 10^{13}$ | — | — | — |
| 200 hrs. | $5 \times 10^{9}$ | | | |
| 500 hrs. | $< 10^{8}$ | | | |

Measurement Methods

1) Voids after Laminate-formation and the Thickness of an Insulation Layer

A copper foil after laminate-formation was removed by etching, and voids were checked by visual observation. A copper foil was removed by etching, and the thickness of an insulation layer was measured with a micrometer.

2) Copper Foil Adhesion Strength

Measured according to JIS C6481.

3) Heat-resistance for Solder after a PCT (Pressure Cooker; 121° C.·203 kPa, 2 hrs.) Treatment The PCT treatment was carried out, and then, failures were checked after immersion in a solder having a temperature of 260° C. for 30 seconds.

4) Circuit Pattern Breakage and Short Circuit

In Examples and Comparative Examples, comb-like patterns having a line/space=50/50 μm were prepared, and then 200 patterns were visually observed through a magnifier after etching. A numerator shows the total of patterns which had a circuit pattern breakage and a short circuit.
5) Glass Transition Temperature
   Measured by a DMA method.
6) Through Hole-heat Cycle Test
   A land having a diameter of 250 μm was formed in each through hole, and 900 holes were connected alternately from one surface to the other surface. One heat cycle consisted of immersion for soldering at 260° C. for 30 seconds and standing at room temperature for 5 minutes, and 150 cycles were repeated. Tables 4 and 5 show the maximum value of change ratios of resistance values. The internal wall surface of each through hole was filled and covered with a resist so as not to allow the solder to attach to the internal wall surface, and the measurement was carried out under this condition.
7) Insulation Resistance Value After Pressure Cooker Treatment
   A comb-shaped pattern between terminals (line/space= 50/50 μm) was formed, prepregs used were placed thereon, the resultant set was laminate-formed, the resultant laminate was treated at 121° C. at 203 kPa for a predetermined period of time and then treated at 25° C. at 60% RH for 2 hours, 500 VDC was applied, and 60 seconds after the application, an insulation resistance between terminals was measured.
8) Anti-migration Properties
   50 VDC was applied to the same test piece as that in the above 7) at 85° C. at 85% RH for a predetermined period of time, and an insulation resistance between terminals was measured.
9) Relative Permittivity
   A measurement was carried out with a LCR meter, and a relative permittivity was calculated.

Examples 7 to 14

1,000 parts of 2,2-bis(4-cyanatophenyl)propane monomer (component A-1) was melted at 150° C., and allowed to react with stirring for 4 hours, to give a prepolymer (component A-2) having an average molecular weight of 1,900. A bisphenol A type epoxy resin (trade name: Epikote 828, supplied by Yuka-Shell Epoxy K.K., component B-1), a bisphenol F type epoxy resin (trade name: EXA830LVP, supplied by Dainippon ink and chemicals, inc., component B-2), a novolak type epoxy resin (trade name: DEN431, supplied by Dow Chemical, component B-3) and a cresol novolak type epoxy resin (trade name: ESCN-220F, supplied by Sumitomo Chemical Co., Ltd., component B-4), as epoxy resins in a liquid state at room temperature, iron acetylacetonate (component C-1) and/or 2-ethyl-4-methylimidazole (component C-2) as heat-curing catalysts and an epoxy silane coupling agent (trade name: A-187, supplied by Nihon Yunika K.K., component D-1) and dicyandiamide (component E-1) as additives in amounts shown in Table 6 were added, to obtain a varnish. As an insulating inorganic filler, a barium titanate-containing ceramic (relative permittivity at 1 MHz at room temperature: 2,010, BET specific surface area: 0.41 $m^2$/g, component F-1), a bismuth titanate-containing ceramic (relative permittivity at room temperature: 733, BET specific surface area: 0.52 $m^2$/g, component F-2), a barium titanate-calcium stannate-containing ceramic (relative permittivity at room temperature: 5,020, BET specific surface area: 0.45 $m^2$/g, component F-3) or a lead titanate-containing ceramic (relative permittivity at room temperature: 1,700, BET specific surface area: 0.80 $m^2$/g, component F-4) was added in an amount shown in Table 6. The mixture was uniformly kneaded with a mixer for 10 minutes. When the kneaded mixture had a high viscosity, a small amount of methyl ethyl ketone was added to the kneaded mixture to adjust its viscosity to a proper viscosity for an application and to prepare a varnish.

The varnish was applied to one surface of a 50 μm thick polyethylene terephthalate film to form a layer having a thickness of 25 to 40 μm, and the layer was heated and dried to obtain B-staged sheets. A highly flat E glass fiber having a thickness of 40 μm, a flatness rate of 4/1, an area ratio of 92%, a calculated fiber diameter of 10 μm, and a length of 13 mm was dispersed in a solution in which polyethylene oxide was dispersed, to prepare a non-woven fabric in which a mass per unit area of the fabric was 15 g/$m^2$. 4% by weight, based on the non-woven fabric, of an adhesive solution containing an epoxy resin emulsion and a silane-coupling agent was attached to the non-woven fabric, and the adhesive solution was dried at 150° C. to obtain a non-woven fabric G. The non-woven fabric G, a general glass woven fabric H having a thickness of 40 μm and a weight of 35 g/$m^2$ and having a fiber cross section which was circle, or a ceramic fiber non-woven fabric I having a relative permittivity of 1,800, a thickness of 45 μm and a weight of 37 g/$m^2$ was disposed between two B-staged sheets obtained above, release films were placed on both the outermost surfaces of the above-obtained set, and these materials were laminated at 100° C. at a linear pressure of 4 kgf/cm to prepare a prepreg (FIG. 1(2)). 12 μm thick electrolytic copper foil(s) were placed on both surfaces, or one surface, of one sheet of the prepreg, and the resultant set was laminate-formed at 200° C. at 20 kgf/$cm^2$ under a vacuum of 30 mmHg or less for 2 hours, to give a double-side copper-clad laminate. Table 7 shows properties of the used inorganic fillers and the like.

Figure 2:
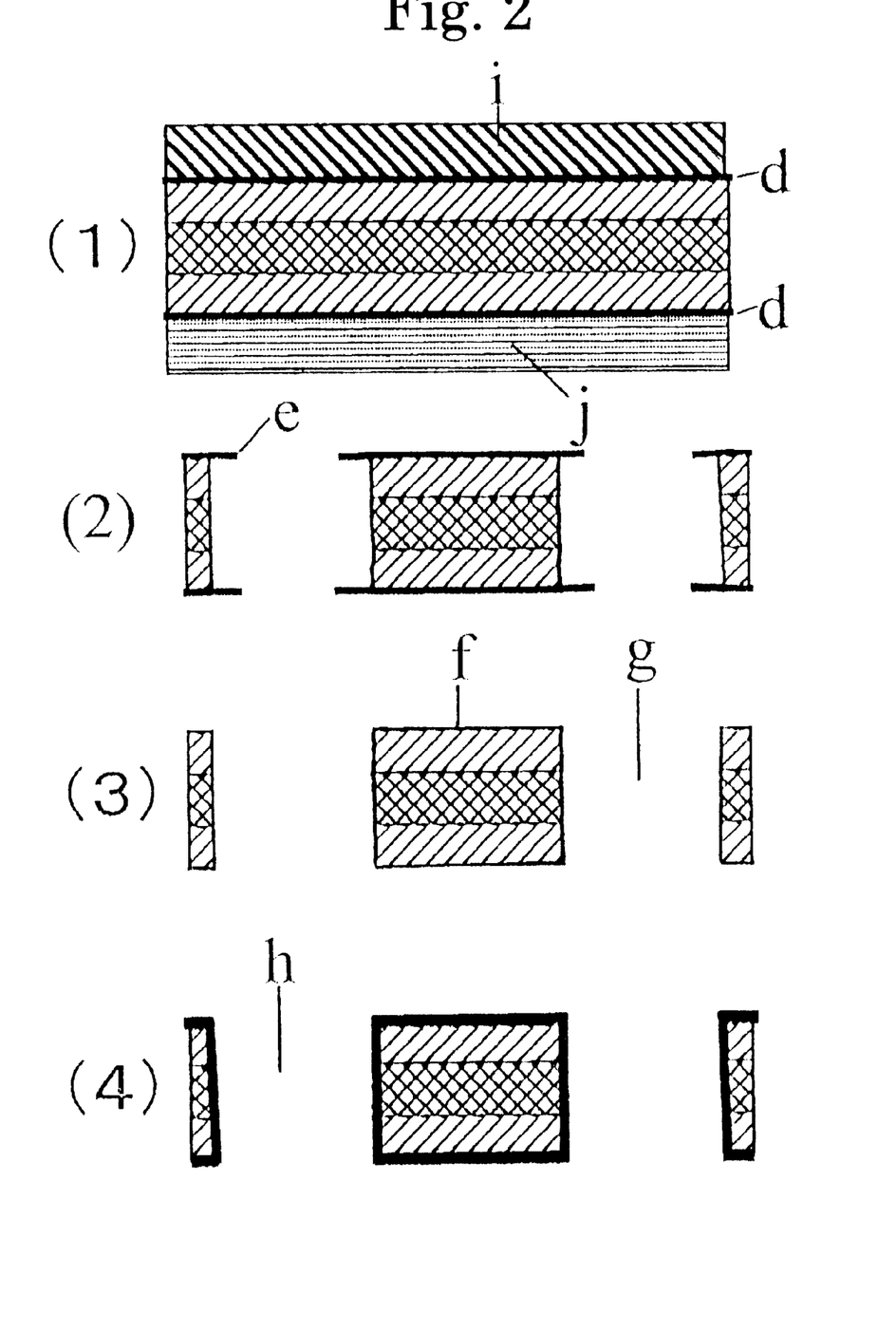
FIG. 2 shows a step of making a penetration hole with a carbon dioxide gas laser (2), a step of removing part of the thickness of a surface copper foil and copper foil burrs in a hole portion by SUEP (3) and a step of copper plating (4).

Separately, 800 Parts of a black copper oxide powder (average particle diameter 0.8 μm) as a metal oxide powder was added to a varnish of a polyvinyl alcohol powder in water, and these materials was homogeneously mixed. The resultant mixture was applied onto one surface of a 50 μm thick polyethylene terephthalate film to form a layer having a thickness of 30 μm, and the layer was dried at 110° C. for 30 minutes to obtain an auxiliary material having a metal compound powder content of 45% by volume. Further, the above varnish was applied to one surface of a 50 μm thick aluminum foil to form a layer having a thickness of 20 μm, and the layer was heated and dried to obtain a backup sheet. The backup sheet was laid down, the double-side copper-clad laminate was placed thereon, the above auxiliary material was placed thereon such that the resin layer faced the copper foil side, and these were laminated at 100° C. (FIG. 2(1)). Then, the auxiliary sheet surface was directly 4 shots irradiated with a carbon dioxide gas laser at an output of 30 mJ to make 144 penetration holes having a diameter of 100 μm in a 20 mm×20 mm square area in each of 70 blocks (FIG. 2(2)). The surface copper foils were etched until the copper foils had a thickness of 3 μm each and burrs around the holes were also dissolved and removed, by a SUEP treatment (FIG. 2(3)). Copper plating was carried out to form a plating layer of 15 μm (FIG. 2(4)). Circuits (line/space=50/50 μm), lands for solder balls, and the like were formed on both the surfaces of the resultant laminate by conventional methods, portions other than at least a semiconductor chip mounting portion, pad portions and solder ball pad portions were coated with a plating resist, and nickel plating and gold plating were carried out to obtain a printed wiring board. Tables 8 and 9 show evaluation results. In FIG. 2, symbols have the following meanings; d: copper foil, e: copper foil burrs occurring when a penetration hole is made with a carbon dioxide gas laser, f: surface copper foils which are decreased in the thickness by SUEP, g: a penetration hole portion treated by SUEP, h: a penetration hole portion plated with copper, i: an auxiliary material for making holes, and j: a backup sheet.

In Example 7 to 14 and Comparative Example 5 to 7, component symbols and substrate symbols have the same meanings.

Comparative Example 5

2,000 parts of an epoxy resin (trade name: Epikote 5045, supplied by Yuka-Shell Epoxy K.K.), 70 parts of dicyandiamide and 2 parts of 2-ethylimidazole were dissolved in mixed solvents of methyl ethyl ketone and dimethylformamide, and these materials were stirred and uniformly dispersed to obtain a varnish (this solid was to be referred to as component B-5). To the varnish added titannic acid-containing ceramic (average particle diameter 1.3 μm, BET specific surface area 1.26 m$^2$/g, relative permittivity 107, component F-5) in an amount shown in Table 6. The mixture was uniformly kneaded, a glass woven fabric having a thickness of 50 μm and a weight of 48 g/m$^2$ was impregnated with the above kneaded mixture, the mixture was dried to obtain a B-staged prepreg. The attached resin layer containing the inorganic filler had some cracks, and it had no flexibility so that the resin was peeled off when bent. While the above B-staged prepreg was carefully handled, 12 μm thick electrolytic copper foils were placed on both the surfaces of the B-staged prepreg, one on one surface one on the other surface. Then, the resultant set was laminate-formed at 190° C. at 20 kgf/cm$^2$ under a vacuum of 30 mmHg or less for 2 hours, to give a double-side copper-clad laminate.

Penetration holes having a diameter of 150 μm each were made in the double-side copper-clad laminate with a mechanical drill. Copper was generally plated to form a layer having a thickness of 15 μm on each surface without the SUEP treatment. The resultant double-side copper-clad laminate was processed to prepare a printed wiring board. Tables 8 and 9 show evaluation results.

Comparative Examples 6 and 7

A titanium dioxide-containing shellac powder (BET specific surface area 1.35 m$^2$/g, relative permittivity 25, component F-6) was added to the same varnish as that in Comparative Example 5, these materials was sufficiently stirred and mixed with a stirrer, a glass woven-fabric was impregnated with the resultant mixture, and the mixture was dried to obtain prepreg. One sheet of the prepreg was provided, 12 μm thick electrolytic copper foils were placed on both the surfaces of the prepreg, and the resultant set was laminate-formed in the same manner as in Comparative Example 1 to obtain a copper-clad laminate. Holes were similarly made in the copper-clad laminate with a mechanical drill, and a printed wiring board was obtained without carrying out the SUEP treatment. Tables 8 and 9 show evaluation results.

TABLE 6

| | Composition | | | | | | | | | | |
|---|---|---|---|---|---|---|---|---|---|---|---|
| Compo- | Examples | | | | | | | | Comparative Examples | | |
| nent | 7 | 8 | 9 | 10 | 11 | 12 | 13 | 14 | 5 | 6 | 7 |
| A-1 | 15 | 15 | 20 | 20 | 25 | 25 | | | | | |
| A-2 | 13 | 13 | 20 | 20 | 20 | 20 | | 60 | | | |
| B-1 | | | 5 | 5 | | | | 10 | | | |
| B-2 | 22 | 22 | 10 | 10 | 15 | 15 | 20 | 10 | | | |
| B-3 | 50 | 50 | 45 | 45 | 40 | 40 | 15 | 10 | | | |
| B-4 | | | | | | | 65 | 10 | | | |
| B-5 | | | | | | | | | 100 | 100 | 100 |
| C-1 | 0.08 | 0.08 | 0.10 | 0.10 | 0.11 | 0.11 | | 0.12 | | | |
| C-2 | 0.5 | 0.5 | 0.1 | 0.1 | | | 0.5 | | | | |
| D-1 | 2 | 2 | 2 | 2 | 2 | 2 | 2 | 2 | 2 | 2 | 2 |
| E-1 | | | | | | | 5 | | | | |
| E-1 | 567 | 900 | | | | | | 400 | | | |
| F-2 | | | 567 | 900 | | | | | | | |
| E-3 | | | | | 567 | 900 | | 100 | | | |
| F-4 | | | | | | | 900 | | | | |
| F-5 | | | | | | | | | 900 | | |
| F-6 | | | | | | | | | | 500 | 900 |

TABLE 7 composition

| Component | Examples | | | | | | | | Comparative Example | | |
|---|---|---|---|---|---|---|---|---|---|---|---|
| | 7 | 8 | 9 | 10 | 11 | 12 | 13 | 14 | 5 | 6 | 7 |
| Width of Particle diameter of inorganic filler (μm) | 3-41 | 3-41 | 3-40 | 3-40 | 3-42 | 3-42 | 5-38 | 5-41 | 0.5-5 | 1-5 | 1-5 |
| Average particle diameter (μm) | 10 | 10 | 6 | 6 | 12 | 12 | 20 | 12 | 1.3 | 2.1 | 2.1 |
| Substrate G | ○ | ○ | ○ | ○ | | | | | ○ | | |
| Substrate H | | | | | ○ | ○ | | | | ○ | |
| Substrate I | | | | | | | ○ | ○ | | | ○ |

TABLE 8

| | Examples | | | |
|---|---|---|---|---|
| | 7 | 8 | 9 | 10 |
| Voids after laminate-formation | No | No | No | No |
| Thickness of insulation layer after laminate-formation (μm) | — | 98 | — | — |
| Copper foil adhesion strength, kgf/cm, 12 μm | 0.95 | 0.64 | 0.94 | 0.70 |
| Heat resistance for solder (260° C. · 30 sec. immersion) after PCT (121° C. · 203 kPa, 2 hrs.) treatment | No failure | No failure | No failure | No failure |
| Pattern breakage and short circuits (number of places) | 0/200 | 0/200 | 0/200 | 0/200 |
| Glass transition temperature (° C.) | 190 | 190 | 212 | 212 |
| Through hole-heat cycle test, % 150 cycles | 1.8 | 1.9 | 2.0 | 2.1 |
| Relative permittivity, (1 MHz) | 27 | 45 | 13 | 20 |
| Insulation resistance value after pressure cooker treatment, Ω | | | | |
| Normal state | — | $4 \times 10^{14}$ | — | $5 \times 10^{14}$ |
| 150 hrs. | | $5 \times 10^{10}$ | | $2 \times 10^{10}$ |
| Anti-migration properties, Ω | | | | |
| Normal state | — | $4 \times 10^{13}$ | — | $5 \times 10^{13}$ |
| 100 hrs. | | $7 \times 10^{11}$ | | $6 \times 10^{11}$ |
| 300 hrs. | | $9 \times 10^{10}$ | | $8 \times 10^{10}$ |

| | Examples | | | |
|---|---|---|---|---|
| | 11 | 12 | 13 | 14 |
| Voids after laminate-formation | No | No | No | No |
| Thickness of insulation layer after laminate-formation (μm) | 118 | — | 97 | 90 |
| Copper foil adhesion strength, kgf/cm, 12 μm | 0.86 | 0.71 | 0.65 | 0.75 |
| Heat resistance for solder (260° C. · 30 sec. immersion) after PCT (121° C. · 203 kPa, 2 hrs.) treatment | No failure | No failure | No failure | No failure |
| Pattern breakage and short circuits (number of places) | 0/200 | 0/200 | 0/200 | 0/200 |
| Glass transition temperature (° C.) | 230 | 230 | 187 | 235 |
| Through hole-heat cycle test, % 150 cycles | 1.7 | 1.8 | 2.5 | 1.6 |
| Relative permittivity, (1 MHz) | 35 | 56 | 113 | 61 |
| Insulation resistance value after pressure cooker treatment, Ω | | | | |
| Normal state | — | $7 \times 10^{14}$ | $5 \times 10^{14}$ | — |
| 150 hrs. | | $5 \times 10^{10}$ | $9 \times 10^{9}$ | |
| Anti-migration properties, Ω | | | | |
| Normal state | — | $8 \times 10^{13}$ | $7 \times 10^{13}$ | — |
| 100 hrs. | | $7 \times 10^{11}$ | $9 \times 10^{10}$ | |
| 300 hrs. | | $4 \times 10^{11}$ | $6 \times 10^{9}$ | |

TABLE 9

| | Comparative Examples | | |
|---|---|---|---|
| | 5 | 6 | 7 |
| Voids after laminate-formation | Voids found in many places | Voids found in some places | Voids found in many places |
| Copper foil adhesion strength, kgf/cm, 12 μm | 0.16 | 0.33 | 0.10 |

TABLE 9-continued

| | Comparative Examples | | |
|---|---|---|---|
| | 5 | 6 | 7 |
| Heat resistance for Solder (260° C. · 30 sec. immersion) after PCT (121° C. · 203 kPa, 2 hrs.) treatment | Swellings largely occur | Swellings partially occur | Swellings largely occur |
| Pattern breakage and short circuits (number of places) | 53/200 | 57/200 | 55/200 |
| Glass transition temperature (° C.) | 137 | 138 | 136 |
| Through hole-heat cycle test, % 150 cycles | — | 11.9 | — |
| Relative permittivity, (1 MHz) | — | 7.4 | — |
| Insulation resistance value after pressure cooker treatment, Ω | | | |
| Normal state 150 hrs. Anti-migration properties, Ω | — | $5 \times 10^{14}$ $< 10^8$ | — |
| Normal state 100 hrs. 300 hrs. | — | $6 \times 10^{13}$ $9 \times 10^9$ $< 10^8$ | — |

Examples 15 to 19

The same components as those used in Examples 7 to 14 were mixed in amounts shown in Table 10. The mixture was uniformly kneaded with a mixer for 10 minutes. When the kneaded mixture had a high viscosity, methyl ethyl ketone in a small amount was added to the kneaded mixture to have a proper viscosity for application and to obtain a varnish. Symbols of the components have the same meanings as those in Examples 7 to 14. The varnish was continuously applied to one surface of a 50 μm thick polyethylene terephthalate (PET) film to form a layer having a thickness of 40 μm, and the layer was dried to obtain B-staged resin sheets having a resin flow of 1 to 20 mm at 170° C. at 20 kgf/cm² for five minutes.

A crystal polyester fiber having a fiber diameter of 13 μm and a length of 16 mm was dispersed in a solution in which polyethylene oxide was dispersed, to prepare a non-woven fabric in which a mass per unit area of the fabric was 30 g/m². 6% by weight, based on the non-woven fabric, of an adhesive solution containing an epoxy resin emulsion and a silane-coupling agent was attached to the non-woven fabric and the adhesive solution was dried at 150° C. to obtain a non-woven fabric. Two B-staged resin sheets obtained above were placed both the surfaces of the non-woven fabric such that the PET film surface of each B-staged resin sheet faced outside, and these materials were continuously laminated with a roll at 100° C. under 5 kgf/cm to integrate these and obtain a B-staged prepreg. The B-staged prepreg was cut so as to have a size of 530×530 mm. The PET films of the cut B-staged prepregs having the above size were peeled off. Three sheets of the resultant B-staged prepregs were stacked. General electrolytic copper foils (JTC-LP, supplied by Japan energy) having a thickness of 12 μm were placed on both the surfaces of the stacked B-staged sheets, and the resultant set was laminate-formed at 200° C. at 30 kgf/cm² under a vacuum of 30 mmHg or less for 2 hours, to give a double-side copper-clad laminate.

Then, the same auxiliary material and backup sheet as those used in Examples 7 to 14 were provided. The auxiliary material was disposed on the upper surface of the double-side copper-clad laminate and the backup sheet was disposed on the lower surface of the double-side copper-clad laminate in the same manner as in Examples 7 to 14 such that the resin layers of the auxiliary material and the backup sheet were respectively faced to the copper foil sides, and these were laminated at 100° C. under 5 kgf/cm. The auxiliary sheet surface was directly 4 shots irradiated with a carbon dioxide gas laser at an output of 30 mJ to make 144 penetration holes having a diameter of 100 μm in a 20 mm×20 mm square area in each of 70 blocks, 10,080 holes in total. The surface copper foils were etched until the copper foils had a thickness of 3 μm each and at the same time burrs around the holes were also dissolved and removed, by a SUEP treatment. Copper plating was carried out to form a plating layer of 15 μm. Circuits (line/space= 50/50 μm), lands for solder balls, and the like were formed on both the surfaces of the board by conventional methods, portions other than at least a semiconductor chip mounting portion, pad portions and solder ball pad portions were coated with a plating resist, and nickel plating and gold plating were carried out to obtain a printed wiring board. Table 11 shows evaluation results.

Comparative Example 8

2,000 parts of an epoxy resin (trade name: Epikote 5045, supplied by Yuka-Shell Epoxy K.K.), 70 parts of dicyandiamide and 2 parts of 2-ethylimidazole were dissolved in mixed solvents of methyl ethyl ketone and dimethylformamide, and these materials were stirred and uniformly dispersed to obtain a varnish (this solid resin component was to be referred to as component B-5). To the varnish added a bismuth titanate-containing ceramic (particle diameter 0.5 to 5 μm, average particle diameter 1.3 μm, BET specific surface area 1.29 m²/g, relative permittivity 730, component F-5) in an amount shown in Table 10. The mixture was uniformly kneaded, a 50 μm thick glass woven fabric was impregnated with the above kneaded mixture, the mixture was dried to obtain a B-staged prepreg. In this case, since the amount of the resin was large, unevenness and cracks were found on the surfaces of the glass woven fabric. A portion where the application of the resin was good was selected, 12 μm thick electrolytic copper foils were placed on both the surfaces thereof, and the resultant set was laminate-formed at 190° C. at 30 kgf/cm² under a vacuum of 30 mmHg or less for 2 hours, to give a double-side copper-clad laminate.

Penetration holes having a diameter of 200 μm each were made in the double-side copper-clad laminate with a mechanical drill. Copper was generally plated to form a layer having a thickness of 15 μm on each surface without the SUEP treatment. The resultant double-side copper-clad laminate was processed to prepare a printed wiring board. Table 11 shows evaluation results.

Comparative Example 9

A titanium dioxide-containing shellac powder (BET specific surface area 1.26 m²/g, relative permittivity 25, component F-6) was added to the same varnish as that in Comparative Example 8, these materials was sufficiently stirred and mixed with a stirrer to obtain a varnish having a titanium dioxide-containing shellac powder content of 90% by weight, a glass woven-fabric was impregnated with the varnish, and the varnish was dried to obtain prepreg. In this case, since the amount of the resin was also large, unevenness and cracks were found on the surfaces of the glass woven fabric. Portions where the application of the resin was good were selected. Four sheets of the selected portion prepregs were stacked, 12 μm thick electrolytic copper foils were placed on both the surfaces of the stacked prepregs, and the resultant set was laminate-formed in the same manner as in Comparative Example 1 to obtain a in copper-clad laminate. Holes were similarly made in the copper-clad laminate with a mechanical drill, to obtain a printed wiring board. Table 11 shows evaluation results.

Comparative Example 10

The same varnish as that in Comparative Example 9 was continuously applied to a 12 μm thick electrolytic copper foil, and dried to obtain a B-staged-resin-attached copper foil having a thickness of 60 μm. Two sheets of the above copper foils were disposed such that the resin layers of the two sheets faced each other, and the resultant set was laminate-formed at 190° C. at 30 kgf/cm² under a vacuum of 30 mmHg or less for 2 hours, to give a double-side copper-clad board. Penetration holes having a diameter of 200 μm each were made in the double-side copper-clad board with a mechanical drill. Copper was generally plated to form a layer having a thickness of 15 μm on each surface without the SUEP treatment. The resultant double-side copper-clad board was processed to prepare a printed wiring board. Table 11 shows evaluation results.

TABLE 11

| | Examples | | | | |
|---|---|---|---|---|---|
| | 15 | 16 | 17 | 18 | 19 |
| Voids after laminate-formation | No | No | No | No | No |
| Copper foil adhesion strength, kgf/cm, 12 μm | 0.96 | 0.71 | 1.10 | 0.87 | 0.61 |
| Heat resistance for solder (260° C. · 30 sec. immersion) after PCT (121° C. · 203 kP, 2 hrs.) treatment | No failure | No failure | No failure | No failure | No failure |
| Pattern breakage and short circuits (number of places) | 0/200 | 0/200 | 0/200 | 0/200 | 0/200 |
| Glass transition temperature (° C.) | 190 | 211 | 226 | 185 | 233 |
| Through hole-heat cycle test, % | | | | | |
| 150 cycles | 1.9 | 2.1 | 1.8 | 2.7 | 1.6 |
| Relative permittivity, (1 MHz) | 21 | 19 | 23 | 32 | 46 |
| Insulation resistance value after pressure cooker treatment, Ω | | | | | |
| Normal state | — | $5 \times 10^{14}$ | — | — | — |
| 200 hrs. | | $3 \times 10^{10}$ | | | |

TABLE 10

| | composition | | | | | | | |
|---|---|---|---|---|---|---|---|---|
| | Examples | | | | | Comparative Examples | | |
| Component | 15 | 16 | 17 | 18 | 19 | 8 | 9 | 10 |
| A-1 | 15 | 20 | 25 | | | | | |
| A-2 | 13 | 20 | 20 | | 60 | | | |
| B-1 | | 5 | | | 10 | | | |
| B-2 | 22 | 10 | 15 | 20 | 10 | | | |
| B-3 | 50 | 45 | 40 | 15 | 10 | | | |
| B-4 | | | | 65 | 10 | | | |
| B-5 | | | | | | 100 | 100 | 100 |
| C-1 | 0.08 | 0.10 | 0.11 | | 0.12 | | | |
| C-2 | 0.5 | 0.1 | | 0.5 | | | | |
| D-1 | 2 | 2 | 2 | 2 | 2 | 2 | 2 | 2 |
| E-1 | | | | 5 | | | | |
| F-1 | 567 | | | | 600 | | | |
| F-2 | | 900 | | | | | | |
| F-3 | | | 567 | | | | | |
| F-4 | | | | 900 | 700 | | | |
| F-5 | | | | | | 400 | | |
| F-6 | | | | | | | 900 | 900 |
| Width of particle diameter of inorganic filler (μm) | | | | | | | | |
| | 3–41 | 3–40 | 3–42 | 5–38 | 5–41 | 0.5–5 | 1–5 | 1–5 |
| Average particle diameter (μm) | | | | | | | | |
| | 10 | 6 | 12 | 20 | 12 | 1.3 | 2.1 | 2.1 |

TABLE 11-continued

Anti-migration properties, Ω

| | | | | | |
|---|---|---|---|---|---|
| Normal state | — | 5 × 10¹³ | — | | |
| 200 hrs. | — | 6 × 10¹¹ | | | |
| 500 hrs. | | 9 × 10¹⁰ | | | |
| Flexural strength | 13 | 11 | 14 | 10 | 14 |

| | Comparative Examples | | |
|---|---|---|---|
| | 8 | 9 | 10 |
| Voids after laminate-formation | Voids found in some places | Voids found in many places | No |
| Copper foil adhesion strength, kgf/cm, 12 μm | 0.48 | — | 0.22 |
| heat resistance for solder (260° C. · 30 sec. immersion) after PCT (121° C. · 203 kP, 2 hrs.) treatment | swelling slightly occurs | Large swelling | No failure |
| Pattern breakage and short circuits (number of places) | 64/200 | 60/200 | 58/200 |
| Glass transition temperature (° C.) | 137 | 138 | 138 |
| Through hole-heat cycle test, % 150 cycles | 8.8 | 15.1 | 35.9 |
| Relative permittivity, (1 MHz) | 11 | — | 7.8 |

Insulation resistance value after pressure cooker treatment, Ω

| | | | |
|---|---|---|---|
| Normal state | 6 × 10¹⁴ | — | — |
| 200 hrs. | <10⁸ | | |

Anti-migration properties, Ω

| | | | |
|---|---|---|---|
| Normal state | 6 × 10¹³ | — | — |
| 200 hrs. | 3 × 10⁹ | | |
| 500 hrs. | <10⁸ | | |
| Flexural strength | — | — | 2 |

Measurement Method

1) Flexural Strength

Measured under conditions where a distance between supports was 20 mm and a width is 20 mm.

What is claimed is:

1. A process for the production of a high relative-permittivity prepreg, comprising preparing B-staged sheets by the use of a resin composition containing 80 to 99% by weight of a powder of an insulating inorganic filler having a relative permittivity of at least 500 at room temperature, sandwiching an inorganic substrate or an organic fiber fabric substrate between the B-staged sheets and integrating these.

2. A process according to claim 1, wherein the inorganic substrate is a glass fiber non-woven fabric having a thickness of 100 μm or less and containing at least 90% by weight of a flat glass fiber of which the cross section is flat and in which a flatness rate, represented by the length/breadth of the cross section, is 3.1/1 to 5/1, the cross sectional area is 90 to 98% of the area of a rectangle circumscribing the glass fiber cross section, and a converted fiber diameter is 5 to 17 μm.

3. A process according to claim 1, wherein the inorganic substrate is an inorganic fiber substrate having a relative permittivity of at least 50.

4. A process according to claim 1, wherein the organic fiber fabric substrate is an aromatic polyester fiber non-woven fabric.

5. A process according to claim 1, wherein the resin component contains, as an essential component, a thermosetting resin composition obtained by incorporating 50 to 10,000 parts by weight of an epoxy resin (b) that is liquid at room temperature into 100 parts by weight of a monomer of a polyfunctional cyanate ester and/or a prepolymer of said cyanate ester (a) and incorporating 0.005 to 10 parts by weight of a heat-curing catalyst per 100 parts by weight of the total amount (a+b).

6. A process according to claim 1, wherein the insulating inorganic filler powder is an inorganic powder containing at least one ceramic selected from the group consisting of a barium titanate-containing ceramic, a strontium titanate-containing ceramic, a lead titanate-containing ceramic, a calcium titanate-containing ceramic, a bismuth titanate-containing ceramic and a lead zirconate-containing ceramic and/or a powder obtained by sintering at least one ceramic selected from the above group and pulverizing the sintered ceramic.

7. A process according to claim 1, wherein the insulating inorganic filler has an average particle diameter of 4 to 30 μm and a specific surface area of 0.30 to 1.00 m²/g.

* * * * *